(12) United States Patent
Kanth et al.

(10) Patent No.: US 8,039,951 B2
(45) Date of Patent: Oct. 18, 2011

(54) THERMALLY ENHANCED SEMICONDUCTOR PACKAGE AND METHOD OF PRODUCING THE SAME

(75) Inventors: Kolan Ravi Kanth, Singapore (SG); Danny Vallejo Retuta, Singapore (SG); Hien Boon Tan, Singapore (SG); Anthony Sun-Yi Sheng, Singapore (SG); Susanto Tanary, Singapore (SG); Patrick Low Tse Hoong, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 492 days.

(21) Appl. No.: 11/495,781

(22) Filed: Jul. 31, 2006

(65) Prior Publication Data

US 2007/0164425 A1 Jul. 19, 2007

Related U.S. Application Data

(60) Provisional application No. 60/759,970, filed on Jan. 19, 2006.

(51) Int. Cl.
*H01L 23/10* (2006.01)

(52) U.S. Cl. ......... 257/706; 257/711; 257/712; 257/722

(58) Field of Classification Search .................. 257/706, 257/712, 722, 711
See application file for complete search history.

(56) References Cited

U.S. PATENT DOCUMENTS

| | | | |
|---|---|---|---|
| 5,822,848 A | 10/1998 | Chiang | |
| 6,049,125 A | 4/2000 | Brooks et al. | |
| 6,229,702 B1 | 5/2001 | Tao et al. | |
| 6,246,115 B1 * | 6/2001 | Tang et al. | 257/706 |
| 6,288,900 B1 * | 9/2001 | Johnson et al. | 361/705 |
| 6,316,717 B1 | 11/2001 | Corisis et al. | |
| 6,432,749 B1 | 8/2002 | Libres | |
| 6,538,321 B2 * | 3/2003 | Huang et al. | 257/706 |
| 6,552,428 B1 * | 4/2003 | Huang et al. | 257/706 |
| 7,009,283 B1 * | 3/2006 | de Simone et al. | 257/675 |
| 7,410,830 B1 * | 8/2008 | Fan et al. | 438/111 |
| 7,468,548 B2 * | 12/2008 | Wu et al. | 257/675 |
| 2002/0074627 A1 | 6/2002 | Combs | |
| 2002/0195701 A1 | 12/2002 | Bemmerl et al. | |
| 2003/0057545 A1 * | 3/2003 | Shim et al. | 257/706 |
| 2003/0134437 A1 | 7/2003 | Lo et al. | |
| 2003/0160323 A1 * | 8/2003 | Tong et al. | 257/737 |
| 2007/0138614 A1 * | 6/2007 | Harrison et al. | 257/686 |

FOREIGN PATENT DOCUMENTS

| | | |
|---|---|---|
| JP | 11-074439 A | 3/1999 |
| WO | 2004/032186 | 4/2004 |

* cited by examiner

*Primary Examiner* — Eugene Lee
*Assistant Examiner* — Anthony Ho
(74) *Attorney, Agent, or Firm* — Sughrue Mion, PLLC

(57) ABSTRACT

This invention includes a heat sink structure for use in a semiconductor package that includes a ring structure with down sets and a heat sink connected to the ring structure. The down sets can be slanted or V-shaped. The invention also includes a method of manufacturing a semiconductor package that includes inserting a substrate with an attached semiconductor chip in a first mold portion, placing a heat sink structure on top of a portion of the substrate, placing a mold release film onto a second mold portion, clamping a second mold portion onto a portion of the heat sink structure, injecting an encapsulant into a mold cavity, wherein the encapsulant surrounds portions of the substrate, semiconductor chip and heat sink structure, curing the encapsulant, whereby the heat sink structure adheres to the encapsulant and singulating the encapsulated assembly to form a semiconductor package.

9 Claims, 7 Drawing Sheets

THERMALLY ENHANCED SEMICONDUCTOR PACKAGE AND METHOD OF PRODUCING THE SAME

This Application claims the benefit of US. Provisional Application No. 60/759,970 filed Jan. 19, 2006.

BACKGROUND OF THE INVENTION

1. Field of the Invention

The present invention relates to a thermally enhanced package for a semiconductor chip and a method of forming the same. It includes, but is not limited to, a package with an integrated heat sink for ball grid arrays (PBGAs and FBGAs), multi chip modules (MCMs) and quad flat nonleaded packages (QFNs).

2. Description of the Related Art

The quest to increase functionality and chip speeds is a continuous ongoing effort by every chip designer in the Semiconductor industry. The increase in signal speeds in the chips poses considerable challenges for thermal management. Higher signal speeds and higher functionality leads to higher junction temperatures. To keep the junction temperatures low, various thermal solutions are available.

Plastic Ball grid array (PBGA) packages are encapsulated individually. Therefore, one thermal solution is a drop-in heat sink that is embedded during encapsulation. However, drop-in heat sinks take-up space within the package, posing constraints in the placement of active chips and other devices. For example, FIG. 2 shows a cross-sectional view of a PBGA package that includes a drop-in heat sink 4.

Highly mass produced laminate based packages such as fine pitch BGAs (FBGAs), are arrayed and are molded in panel form and singulated to produce individual FBGA packages. Arrayed packages don't allow space for individual drop-in heat sinks and it is not economical to waste substrate real estate to have individual drop-in heat sinks for FBGA. Therefore, some approaches to deal with thermal management include the use of arrayed heat sinks with connecting down sets. However, these types of heat sinks have quality issues such as mold flash during the molding process. These quality issues lead to both aesthetic and as well as thermal performance problems.

Other known methods of incorporating heat sinks into packages also have several disadvantages. For example, they include multiple process steps which increase production time and costs. In addition, the heat sinks can be misaligned. Also, heat sinks can be easily peeled-off.

One of the current methods of producing a thermally enhanced semiconductor package is by attaching the heat sink 1 onto top surface of the fully molded semiconductor package by means of an adhesive layer 3 as shown in FIG. 1. However, this method provides an inconsistent adhesive coverage when the heat sink is attached, which might lead to easy removal of the heat sink. Other issues encountered with this method include controlling the amount of adhesive 3 needed to attach the heat sink 1 to the molded surface 2. Excessive adhesive 3 can cause bleed out, which ultimately contaminates the package edges or the contact pads. Insufficient adhesive coverage can also cause large gaps that adversely affect thermal performance. Finally, attaching heat sink 1 after singulation is not economically viable considering the mass scale production requirements of the package.

One object of the present invention is to provide a method of packaging an embedded heat sink semiconductor package whereby the semiconductor package has good thermal characteristics and can be assembled with a simple manufacturing process.

Another object of the present invention is to provide a heat sink structure that provides a vertical cushioning effect during molding.

Another object of the present invention is to provide a heat sink structure that created a lifting force that keeps the heat sink structure engaged with the release film during molding.

Another object of the present invention is to provide a heat sink structure that inhibits mold flash on the heat sinks.

Another object of the present invention is to provide a package that includes a notch of encapsulant around the corner of the package to act as an interlock for the heat sink, enhancing the holding strength between the heat sink and cured encapsulant.

Some of the innovativeness of this package is that it can be applied to any arrayed, lead frame based or laminate based packages which are molded on one side of the substrate. The heat sink can be any thermally conductive material (for example, copper).

SUMMARY OF THE INVENTION

This invention includes a heat sink structure for use in a semiconductor package that includes a ring structure with down sets and a heat sink connected to the ring structure. The down sets can be slanted or V-shaped.

The heat sink structure may include a plurality of heat sinks, including the plurality of heat sinks being arranged in an array. Also, the heat sink structure may include a plurality of heat sink arrays.

The heat sink structure may include etched tie bars that connect the heat sink to the ring structure and alignment holes for aligning the heat sink and substrate.

The invention also includes a method of manufacturing a semiconductor package that includes inserting a substrate with an attached semiconductor chip in a first mold portion, placing a heat sink structure on top of a portion of the substrate, placing a mold release film onto a second mold portion, clamping a second mold portion onto a portion of the heat sink structure, injecting an encapsulant into a mold cavity, wherein the encapsulant surrounds portions of the substrate, semiconductor chip and heat sink structure, curing the encapsulant, whereby the heat sink structure adheres to the encapsulant, removing the encapsulated assembly from the mold and singulating the encapsulated assembly to form a semiconductor package.

The method may also include using a vacuum to force the mold release film onto the second mold portion.

The method may also include attaching solder balls to the substrate and aligning the substrate with attached semiconductor chip and heat sink structure in the first mold portion through the use of guide pins.

The method may also include singulating the encapsulated package through a down set or etched tie bar.

When the method is used the down sets may create a lifting force when the encapsulant is injected in the mold cavity, may provide a cushioning effect and may keep the heat sink on the heat sink structure engaged with said mold release film while said encapsulant is being injected in to the mold cavity.

The method may also include attaching a high temperature tape on a bottom portion of the substrate wherein the high temperature tape will fit into a relief slot in the first mold portion.

The invention also includes a semiconductor package that includes a semiconductor chip attached to a substrate, an encapsulant covering portions of the semiconductor chip and substrate and comprising a top surface, and a heat sink in direct contact with the entire top surface of the encapsulant. The heat sink becomes adhered to the top surface of the encapsulant as the encapsulant cures and a notch at a top corner of semiconductor package is filled with the encapsulant.

The notch may be defined by a side of the heat sink and a down-set or by a side of the heat sink and a tie bar and acts as an interlock for the heat sink, enhancing the holding strength between the heat sink and cured encapsulant.

The package may also include solder balls connected to the substrate and the semiconductor chip being wire bonded to the substrate.

The package may include a substrate that is a laminate structure or a metal lead-frame structure. In addition, the semiconductor package may be a ball grid array package, a quad flat nonleaded package or is a multi chip module package.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

Figure 1:
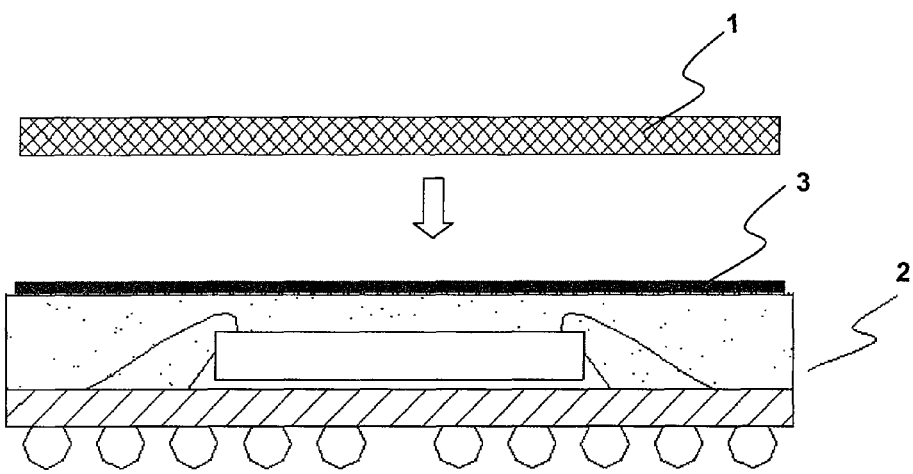
FIG. 1 illustrates a conventional method of producing the thermally enhanced semiconductor package.
Figure 2:
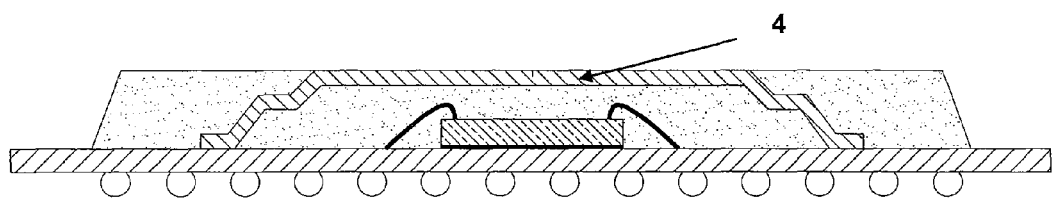
FIG. 2 illustrates another conventional method of producing a thermally enhanced semiconductor package.

DETAILED DESCRIPTION OF THE ILLUSTRATIVE NON-LIMITING EMBODIMENTS OF THE INVENTION

Hereinafter, the present invention will be described in detail by way of exemplary embodiments with reference to the drawings. The described exemplary embodiments are intended to assist in the understanding of the invention, and are not intended to limit the scope of the invention in any way.

Throughout the drawings for explaining the exemplary embodiments, those components having identical functions carry the same reference numerals for which duplicate explanations will be omitted.

Figure 3:
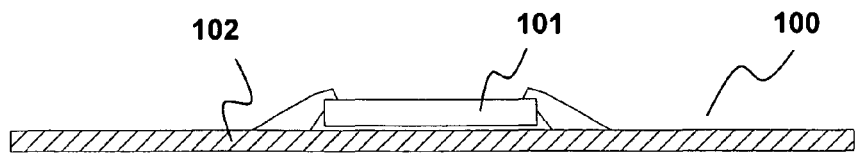
FIGS. 3-9 illustrate a method according to the present invention of producing a thermally enhanced semiconductor package.

A non-limiting embodiment of a method for thermally enhancing a semiconductor package is described below. First, as shown in FIG. 3, a chip 101 is attached to a substrate 102. Substrate 102, can be a laminate structure or metal lead-frame. Item 100 represents the substrate and attached chip assembly. Several methods may be used to attach the chip to the substrate. For example, epoxy dispense/print and chip attach or a pre-taped chip can be directly attached to the substrate. In addition, the chip 101 may be wire bonded to the substrate. However, the present invention is not limited to wire bonded chips. For example, it could apply to flip chips, and the like.

Figure 4:
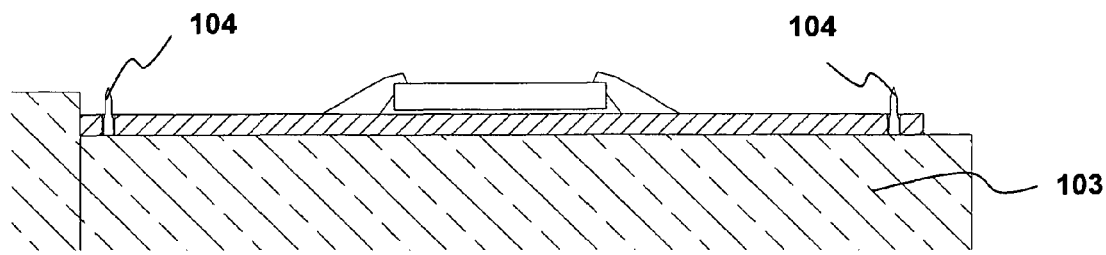

Next, as shown in FIG. 4, substrate and attached chip assembly 100 is loaded onto a bottom mold portion 103. The substrate 102 may contain alignment holes through which guide pins 104 are inserted. Other known alignment methods could also be used.

Figure 5:
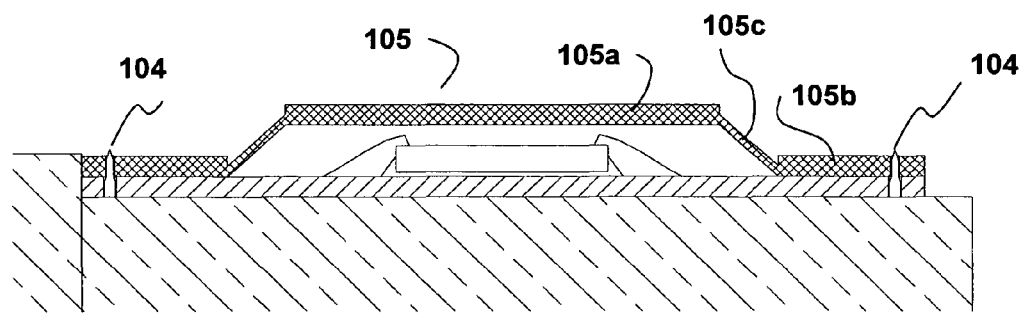

In FIG. 5, heat sink structure 105, which includes heat sink 105a, rail/frame carrier 105b and down-set 105c is placed on top of the substrate 102. Heat sink structure 105 can be in a strip form. Heat sinks are metal structures capable of absorbing heat from the chip and dissipating heat to the environment. To ensure proper alignment between heat sink structure 105 and substrate 102, the heat sink structure may also contain alignment holes through which the same set of guide pins 104 are inserted. Other known alignment methods could also be used.

Figure 6:
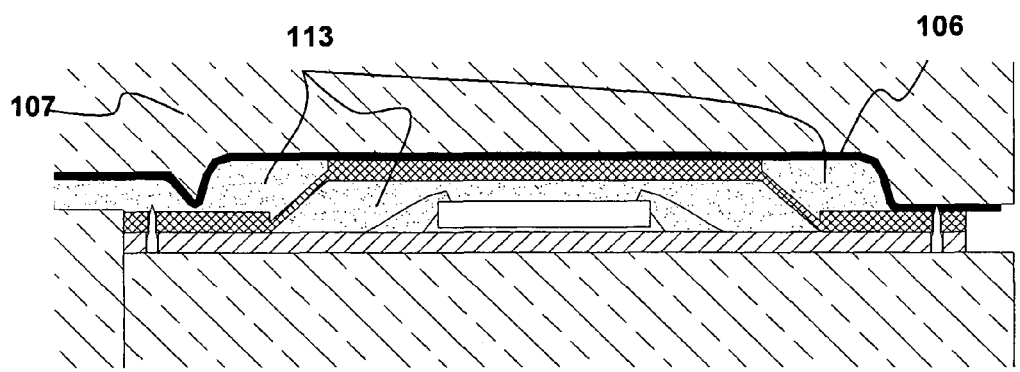

As shown in FIG. 6, top mold portion 107 and bottom mold portion 103 are then closed to start the encapsulation process. Top mold portion 107 is clamped on heat sink structure rail 105b.

Figure 18:
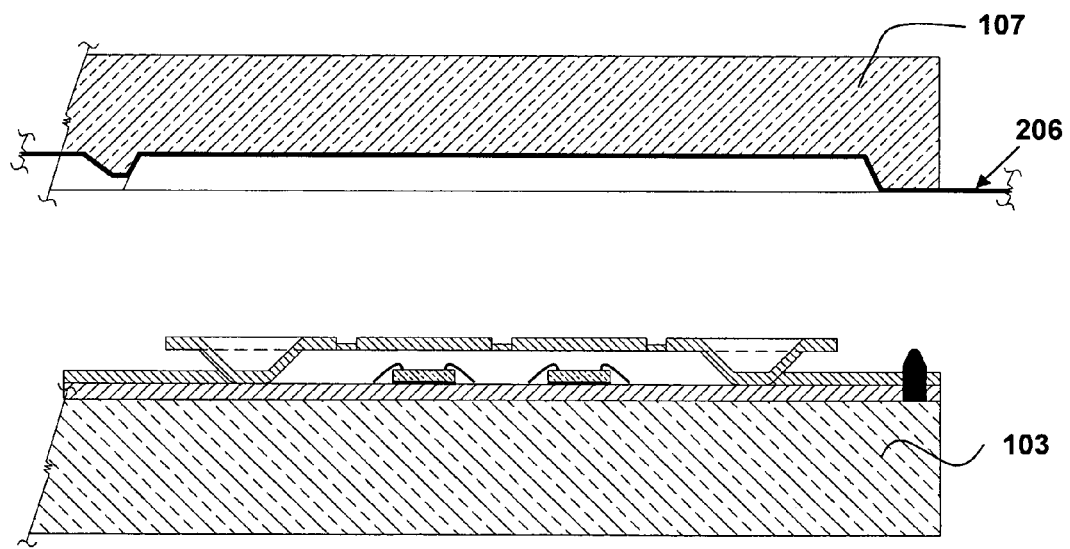
FIG. 18 shows an example of a mold release film being forced up against the top mold portion by a vacuum and conforming to the mold cavity.

A mold release film 106 can be inserted between the top mold portion 107 and the heat sink 105a. The mold release film protects the surface of the heat sink 105a and prevents contamination from the encapsulation material. Examples of mold release films are ETFE films which can withstand molding temperatures. If a mold release film is used, one method of using it in the mold it to use a vacuum to force the mold release film 106 up against the top mold portion 107 and conform the film to the shape of the cavity. An example of the mold release film being forced up against the top mold portion by a vacuum is shown in FIG. 18. Other methods may be used to insert the mold release film between the heat sink structure and top mold portion.

During the encapsulation process, an encapsulant 113, such as a thermo set epoxy, is injected into the mold to fill the open spaces and is cured. The bottom of heat sink structure 105 becomes adhered to the top surface of the encapsulant as the encapsulant cures.

Molding with a release film is well known to those of skill in the art; therefore, a detailed explanation is not provided. The only surface the release film that is in contact with the heat sink structure 105 is the portion above the top surface of the heat sink 105a and the other portion above the rail portion 105b that is clamped by the top mold portion 107. The mold release film prevents mold compound flash and ultimately prevents any contamination of the top surface. The mold compound is in contact with all the surfaces except the top surface of the heat sink 105a and the portion above the rail portion 105b that is clamped by the top mold portion 107. As compound cures it adheres to the contacting surfaces.

After the molding process is finished, the mold is opened and the release film is automatically detached. Then a fresh film is propagated for next molding cycle.

Figure 7:
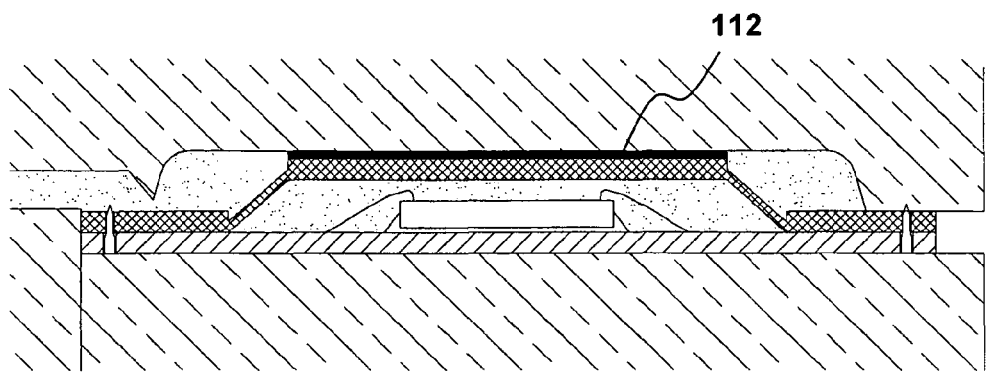

Heat sink structure 105 can also be laminated with a protected film 112, in lieu of a mold release film 106. See, for example, FIG. 7. After the encapsulation process, the protective film is removed.

Figure 8:
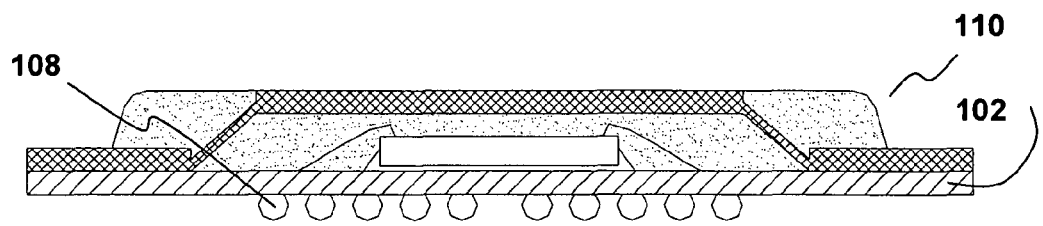

The top and bottom mold portions are then separated and the encapsulated package 110 is ejected from the mold. After the molding process, the strips undergo a ball mount process, where solder balls are attached on the solder pads of the substrate. Solder balls 108 are attached to the molded substrate 102 by conventional methods. See FIG. 8. The present invention is also applicable to packages that do not use solder balls, such as lead frame based packages like quad flat non leaded package (QFNs).

Lead frame based packages usually undergo a plating process after molding and prior to singulation.

Figure 9:
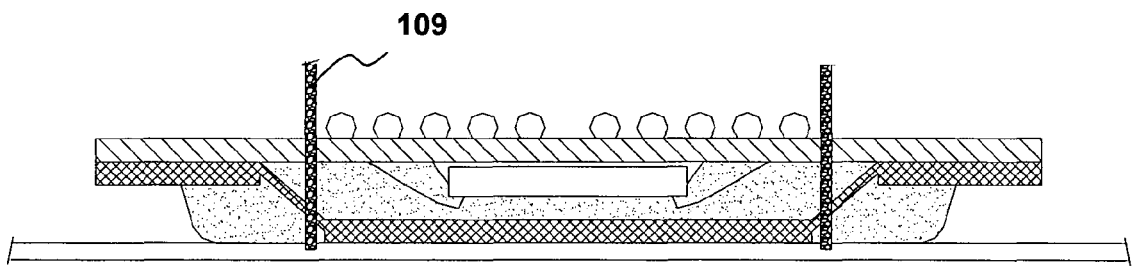

The molded package 110 is then cut to size by sawing. For example, a singulation blade 109 can be used to dice the desired area. See FIG. 9. Because the molded package 110 is cut through the down-set 105c and not at the edge of the heat sink 105a, a notch 114 filled with the encapsulant is at the corner of the package. The filled notch at the top corner acts as an interlock for the heat sink, enhancing the holding strength between the heat sink and cured encapsulant.

Figure 10:
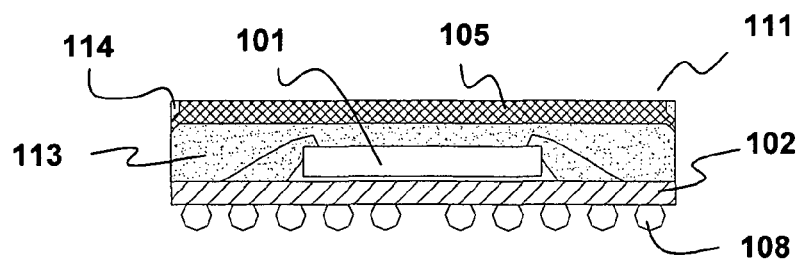
FIG. 10 illustrates an embodiment of a thermally enhanced semiconductor package.

FIG. 10 shows a final semiconductor package 111.

Figure 11:
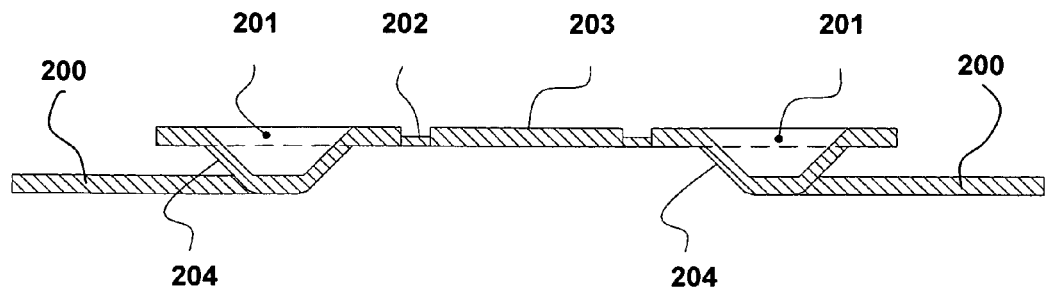
FIGS. 11-12 illustrate another method according to the present invention of producing a thermally enhanced semiconductor package.

Another embodiment of the present invention includes an integrated heat sink structure. FIG. 11 is a cross-sectional view of the integrated heat sink structure. It consists of ring structure 201. The heat sinks 203 are encompassed within the heat sink structure and are connected to the ring structure 201 through half etched tie bars 202. "V" shaped down-sets 204 are created on the ring structure 201. At least one aspect of the innovativeness of the integrated heat sink is the ability of single feature to have multiple functions. The ring structure 201, apart from carrying the heat sinks, also helps to prevention mold flash by being a barrier to the mold compound flow. Ring structure 201 also includes "V" shaped down-sets 204. The "V" shaped down-sets 204, support the ring structure 201. They also act as connecting links to the frame carrier 200. The "V" shaped down-sets 204 also translate drag force associated with mold compound flow into a vertical force cushioning the heat sink against release film 206 (shown on FIG. 12).

Figure 12:
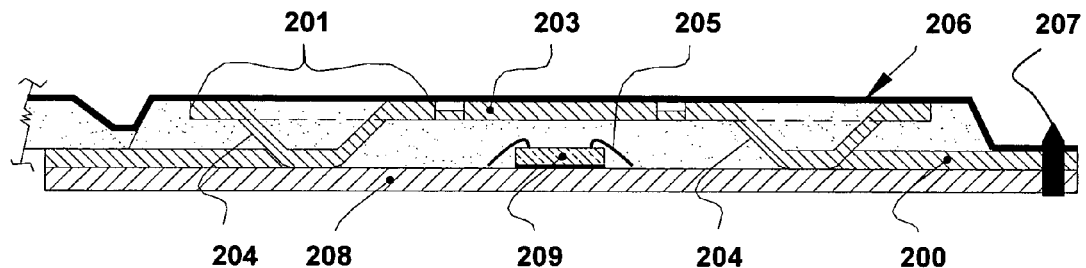

FIG. 12 shows the molding process with integrated heat sinks 203. The molding process is essentially the same as the previous embodiment. The heat sink frame carrier 200 carrying the integrated heat sinks is aligned and loaded on top of the substrate 208. The substrate and heat sink frame carrier 200 may make use of a locating pin 207 on the mold tooling for alignment purposes. Prior to the mold being enclosed, a vacuum may be used to force the mold release film 206 against the top mold portion. See for example, FIG. 18. Other methods may be used to insert the mold release film between the heat sink structure and top mold portion. As mold is closed, the "V" shaped down sets 204 provide a cushioning effect and keep the heat sinks 203 engaged at all times with the release film 206. During the molding process as the mold compound enters the mold cavity, the flow first hits the ring structure 201 and the "V" shaped down sets 204. The flow induced force on the "V" shaped down-sets 204 creates a lifting force (based on the orientation of the heat sink structure shown in FIG. 12), keeping the ring structure 201 and heat sinks 203 always engaged with the release film 206. The ring structure 201 also helps in inhibiting mold flash on the heat sinks 110, by absorbing most of the flow induced forces.

Figure 13:
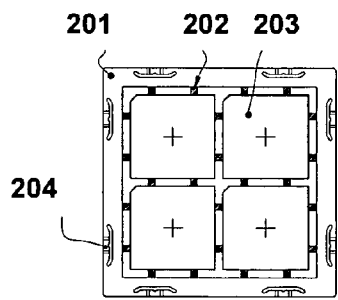
FIGS. 13 and 14 show top views of 2×2 array and 3×3 array of heat sinks.
Figure 14:
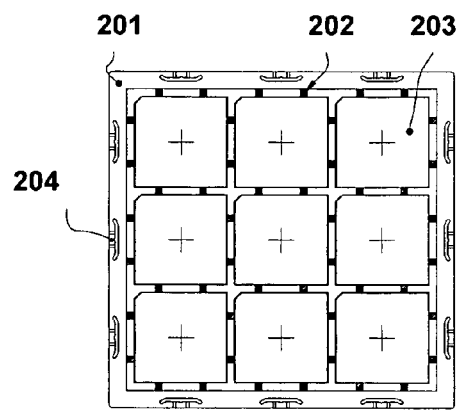

FIG. 13 shows a top view of 2×2 array of heat sinks 203. FIG. 14 shows a top view of a 3×3 array of heat sinks 203. A common feature of these two array structures is a ring structure 201, encompassing the heat sinks 203. Another advantage of having the ring structure 201 is having only a one time tooling cost on the down-set 204 creations. Irrespective of the array types of heat sinks 203, 2×2, 3×3 or any array size, each mold cavity size can have only a one time down-set tooling cost. This also helps in standardizing the tooling and processes involved.

Figure 19:
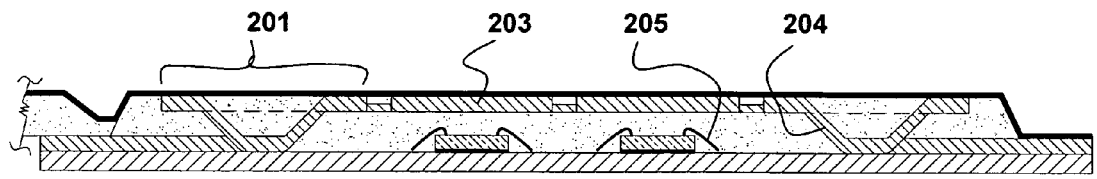
FIGS. 19 and 20 show cross-sectional views of 2×2 and 3×3 array heat sinks.

FIGS. 18 and 19 show cross-sectional views of 2×2 and 3×3 array heat sinks. The figures also show one example of the molding concept of 2×2 and 3×3 array heat sinks.

Figure 15:
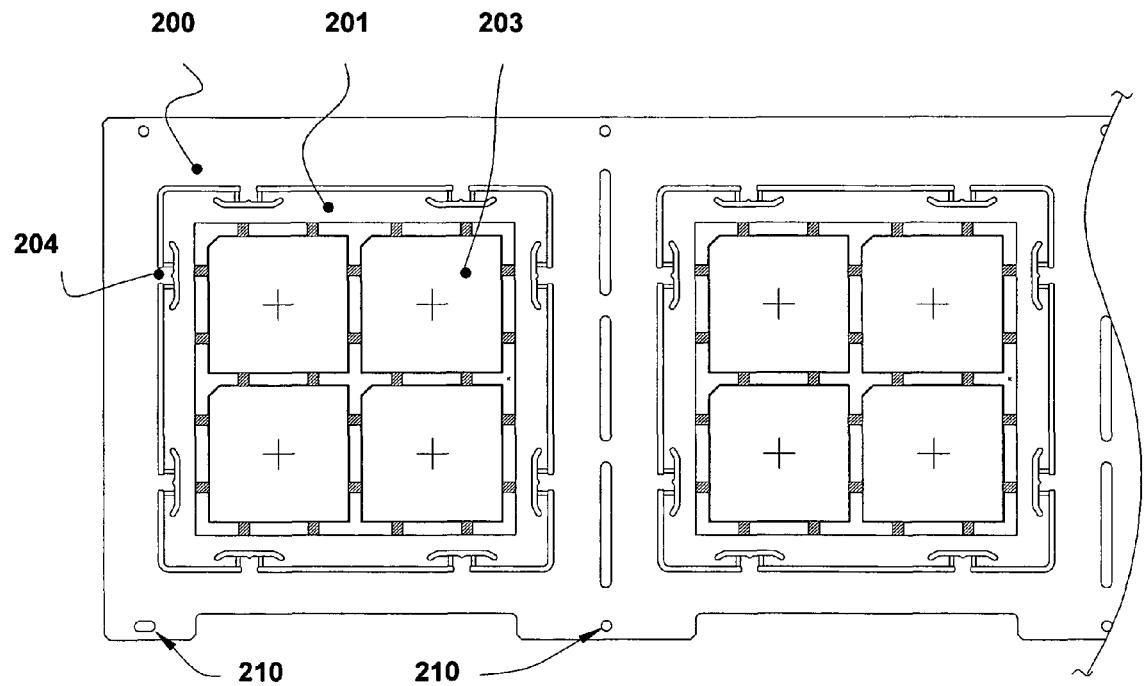
FIG. 15 shows a partial plan view of a heat sink frame carrier.

FIG. 15 shows a partial plan view of heat sink frame carrier 200, connected to the ring structure 201 through the down-sets 204. The down-sets 204, apart from supporting the heat sinks, provide a vertical cushioning effect during molding. The down-sets 204 also act as connectors to the frame carrier 200. The heat sink carrier frame 200 includes alignment features 210 that are used to locate and align the heat sink strip and the substrate 208 (shown in FIG. 12) during molding process. FIG. 15 also shows an embodiment of a heat sink frame carrier that includes a plurality of heat sink arrays.

Figure 16:
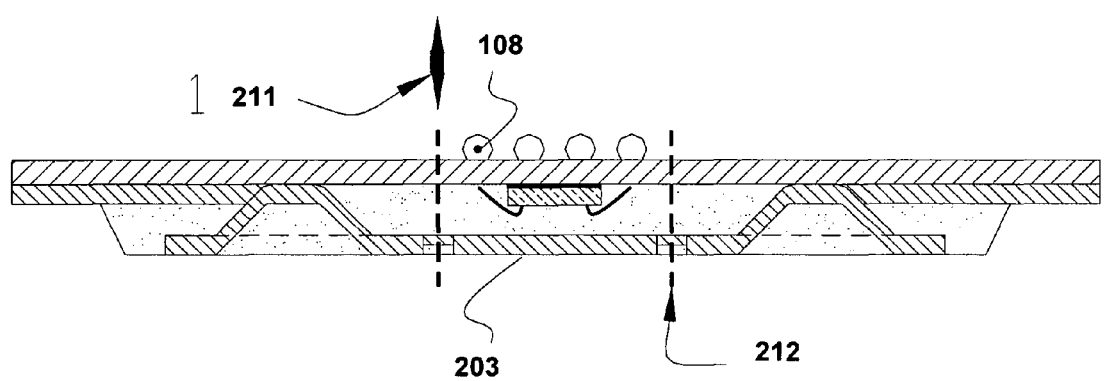
FIG. 16 shows a flash free molded package with a heat sink 203.

FIG. 16 shows a flash free molded package with heat sink 203 exposed. After molding, the solder balls 108 are mounted on the package and package singulated along package edge 212 through the tie bars 202. Because the molded package is cut through the tie bars 202 and not at the edge of the heat sink 203, a notch 214 filled with the encapsulant is at the corner of the package. The filled notch at the top corner acts as an interlock for the heat sink, enhancing the holding strength between the heat sink and cured encapsulant. Lead frame based packages do not undergo a solder ball mount process. Rather, lead frame based packages after molding will undergo a plating process prior to singulation. Singulation is done with saw blade 211. Both the ball mount and singulation processes are standard processes know to those of skill in the art in the industry.

Figure 17:
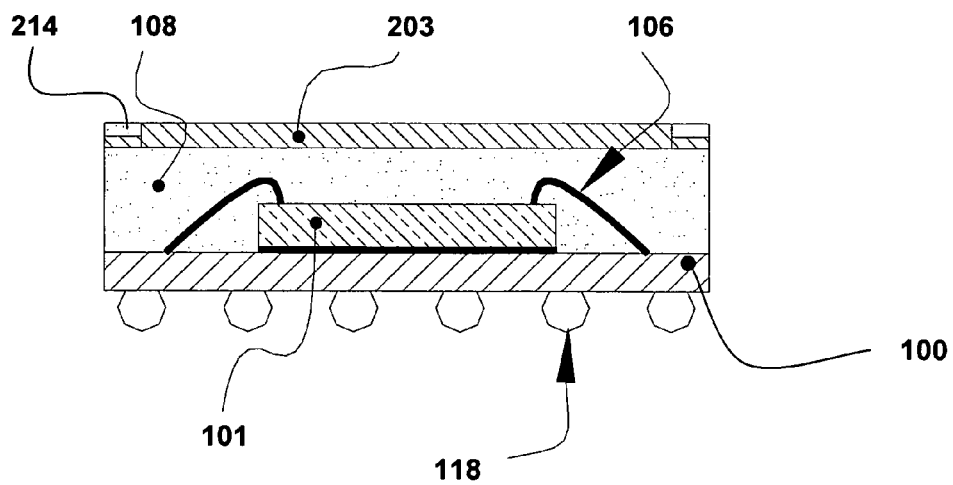
FIG. 17 shows a completely assembled thermally enhanced semiconductor package with an embedded heat sink.

FIG. 17 shows a complete assembled thermally enhanced semiconductor package with embedded heat sink 203. With the substrate 100 being an insulator, the heat sink 203 greatly enhances the performance of the package by removing the heat generated from the chip 101 and keeping the junction temperatures low. The integrated heat sink design and the proposed method enable a cost effective way of mass producing thermally enhanced semiconductor package.

Figure 20:
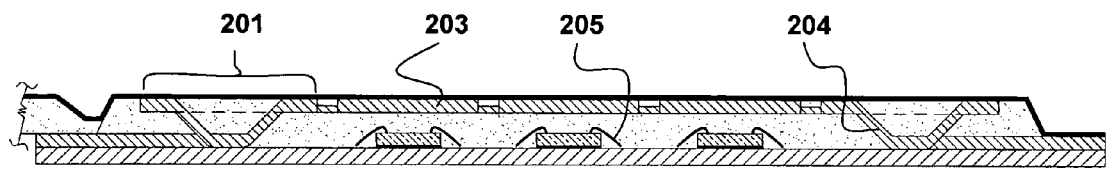
Figure 21:
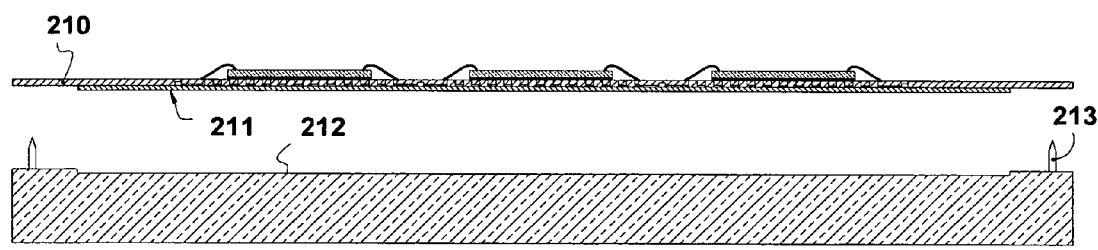
FIGS. 21 and 22 show an assembly concept of a QFN package with an integrated heat sink.
Figure 22:
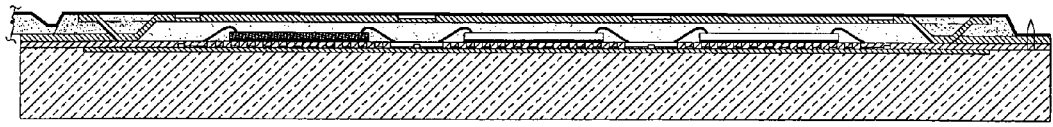

Other packages to which the integrated heat sink can be applied to enhance the thermal performance include QFN and MCM packages. QFN packages, like laminate based packages, are molded on one side. FIGS. 20 and 21 below show an example of the assembly concept of a QFN package with an integrated heat sink.

Most of the QFN lead-frames 210 shown in FIG. 21 have high temperature tape 211 at the bottom of the strip to prevent any mold compound flash. After molding, the high temperature tape is de-taped, the molded strips are plated, then sawed. So for high thermal performance an integrated heat sink is dropped in the mold prior to molding. FIG. 19 shows a QFN frame 210, being loaded on to the bottom mold chase surface 212. The mold chase surface 212, has a relief slot for the high temperature tape 211 of the lead frame 210. The lead frame is located using the locating pin 213. The same locating pin 213 is also used to locate the heat sink during molding. Other known alignment methods may also be used.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A heat sink structure for use in a semiconductor package having a substrate with an attached semiconductor chip comprising:
   a ring structure with down sets; and
   a heat sink connected along a same plane to said ring structure;
   wherein said ring structure has a V-shaped down set extending from the plane to the substrate; and
   wherein the heat sink is connected to the ring structure by etched tie bars.

2. The heat sink structure of claim 1 wherein the heat sink structure comprises a plurality of heat sinks.

3. The heat sink structure of claim 2 wherein the plurality of heat sinks are arranged in an array.

4. The heat sink structure of claim 3 further comprising a plurality of heat sink arrays.

5. The heat sink structure of claim 1 further comprising alignment elements.

6. The heat sink structure of claim 5, wherein the alignment elements are holes.

7. The heat sink structure of claim 1 wherein the entire heat sink is in the plane.

8. The heat sink structure of claim 1 wherein the ring structure surrounds the heat sink.

9. The heat sink structure of claim 2 wherein the ring structure surrounds the plurality of heat sinks.

* * * * *